US012660668B2

(12) United States Patent
Lee et al.

(10) Patent No.: US 12,660,668 B2
(45) Date of Patent: Jun. 16, 2026

(54) SINTERING FILM FRAMES AND RELATED METHODS

(71) Applicant: SEMICONDUCTOR COMPONENTS INDUSTRIES, LLC, Scottsdale, AZ (US)

(72) Inventors: Dukyong Lee, Bucheon (KR); Hao Yan, Shan (CN); Kun Feng, Shanghai (CN)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 496 days.

(21) Appl. No.: 18/179,072

(22) Filed: Mar. 6, 2023

(65) Prior Publication Data

US 2024/0304596 A1     Sep. 12, 2024

(51) Int. Cl.
*H10W 72/00*          (2026.01)
*H10W 72/30*          (2026.01)

(52) U.S. Cl.
CPC ....... *H10W 72/073* (2026.01); *H10W 72/013* (2026.01); *H10W 72/30* (2026.01); *H10W 72/01304* (2026.01); *H10W 72/01323* (2026.01); *H10W 72/01333* (2026.01); *H10W 72/01336* (2026.01); *H10W 72/01351* (2026.01); *H10W 72/01365* (2026.01); *H10W 72/07331* (2026.01); *H10W 72/07332* (2026.01); *H10W 72/352* (2026.01)

(58) Field of Classification Search
CPC ......... H01L 24/30; H01L 24/27; H01L 24/83; H01L 24/29; H01L 2224/2711; H01L 2224/8384; H01L 2224/83201; H01L 2224/27848; H01L 2224/83005; H01L 2224/27438; H01L 2224/29139; H01L 2224/26; H01L 2224/277; H01L 2224/27; H01L 2224/2732; H01L 2224/83101; H01L 2224/83104; H01L 2224/27418; H01L 2224/29147; H01L 2224/27003; B22F 7/04; B22F 7/08; B22F 2007/042; H01M 4/131; H01M 10/0525; H01M 4/485; H01M 4/133; H01M 10/0585; H01M 10/0562; H01M 4/525; H01M 4/62; H01M 50/103; H01M 50/122; H01M 10/052; H01M 50/531; H01M 50/548; H01M 50/543; H01M 2300/0065; H01M 2004/021; H01M 2004/028; H01M 2300/0068
See application file for complete search history.

(56) References Cited

U.S. PATENT DOCUMENTS 5,726,920 A * 3/1998 Chen .................. G01R 31/2831
                                          324/750.01
6,112,740 A      9/2000 Mark et al.
(Continued)

FOREIGN PATENT DOCUMENTS

JP        2021024145 A      2/2021
KR        102087022 B1      3/2020

*Primary Examiner* — Mouloucoulaye Inoussa
(74) *Attorney, Agent, or Firm* — IPTechLaw

(57)          ABSTRACT

Implementations of a sintering film frame may include a frame including an outer perimeter and an inner perimeter, the inner perimeter defining an opening through the frame; a position detection opening through the frame; at least two alignment holes through the frame; and a frame identifier on a side of the frame.

20 Claims, 9 Drawing Sheets

(56) References Cited

U.S. PATENT DOCUMENTS

| | | | | |
|---|---|---|---|---|
| 7,223,320 | B2 | 5/2007 | Arneson et al. | |
| 7,598,120 | B2 | 10/2009 | Yamamoto et al. | |
| 2003/0201524 | A1* | 10/2003 | Murakami | H01L 25/0657 |
| | | | | 257/E23.179 |
| 2004/0016939 | A1* | 1/2004 | Akiba | H01L 23/544 |
| | | | | 257/E21.705 |
| 2004/0195701 | A1* | 10/2004 | Attarwala | H01L 23/49816 |
| | | | | 257/E23.101 |
| 2005/0085034 | A1* | 4/2005 | Akiba | H01L 21/565 |
| | | | | 257/E21.705 |
| 2005/0252571 | A1* | 11/2005 | Nakano | H01L 21/67772 |
| | | | | 141/66 |
| 2007/0274814 | A1* | 11/2007 | Kawasaki | H01L 21/6773 |
| | | | | 414/217.1 |
| 2010/0240820 | A1* | 9/2010 | Sato | C08L 67/04 |
| | | | | 524/529 |
| 2011/0291293 | A1* | 12/2011 | Tuominen | H01L 25/0652 |
| | | | | 257/774 |
| 2015/0163920 | A1* | 6/2015 | Tuominen | H01L 24/18 |
| | | | | 361/761 |
| 2015/0380356 | A1* | 12/2015 | Chauhan | H01L 23/5386 |
| | | | | 257/774 |
| 2016/0027694 | A1* | 1/2016 | Truhitte | H01L 24/49 |
| | | | | 438/107 |
| 2018/0061692 | A1* | 3/2018 | Nishino | G05B 19/41865 |
| 2019/0378734 | A1* | 12/2019 | Ehrne | H01L 21/67778 |
| 2020/0006164 | A1* | 1/2020 | Yu | H01L 21/568 |
| 2020/0388509 | A1* | 12/2020 | Nomura | H01L 23/293 |
| 2021/0346983 | A1* | 11/2021 | Leschkies | B23K 26/40 |
| 2022/0013873 | A1* | 1/2022 | Kumagae | H01M 10/0562 |
| 2022/0302506 | A1* | 9/2022 | Nakano | H01M 10/0562 |
| 2022/0320590 | A1* | 10/2022 | Iwane | H01M 4/131 |
| 2024/0021452 | A1* | 1/2024 | Hwang | H01L 21/681 |

* cited by examiner

SINTERING FILM FRAMES AND RELATED METHODS

BACKGROUND

1. Technical Field

Aspects of this document relate generally to semiconductor die bonding systems and methods.

2. Background

Semiconductor packages have been devised that allow for routing of electrical connections on a semiconductor die out to a circuit board to which the semiconductor die communicates. Semiconductor packages also work to protect semiconductor die from humidity, mechanical stress, mechanical shock, or electrostatic discharge.

SUMMARY

Implementations of a sintering film frame may include a frame including an outer perimeter and an inner perimeter, the inner perimeter defining an opening through the frame; a position detection opening through the frame; at least two alignment holes through the frame; and a frame identifier on a side of the frame.

Implementations of sintering film frames may include one, all, or any of the following:

The shape of the outer perimeter may be one of elliptical, circular, a rounded rectangle, or a rounded square.

The shape of the outer perimeter may be one of rectangular, square, or a quadrilateral.

The shape of the inner perimeter may be one of elliptical, circular, a rounded rectangle, or a rounded square.

The shape of the inner perimeter may be one of rectangular, square, or a quadrilateral.

The frame identifier may be one of a barcode, a two dimensional barcode, or a set of characters.

The material of the frame may be one of a plastic or stainless steel.

Implementations of a method of preparing sintering film may include coupling a release film to a plurality of sintering films so each of the plurality of sintering films may be arranged in a spaced apart relationship from each other sintering film of the plurality of sintering films on the release film and coupling a plurality of sintering film frames to the release film, each of the plurality of sintering film frames coupled around each of the plurality of sintering films. The method may include applying pressure between the plurality of the sintering film frames and the release film; cutting the release film around each of the plurality of sintering film frames to singulate the plurality of sintering film frames; and packing the plurality of sintering film frames into a frame transport container.

Implementations of a method of preparing sintering film may include one, all, or any of the following:

The method may include casting a master sintering film and cutting the master film into the plurality of sintering films.

The method may include visually inspecting the plurality of sintering films after cutting the release film prior to packing the plurality of film frames and recording one of an order, an identity, or both an order and an identity of each of the sintering film frames using a frame identifier of each of the sintering film frames while packing the plurality of sintering film frames into the frame transport container.

The method may include where coupling the release film to the plurality of sintering films further may include one of: screen printing sintering paste onto the release film to form the plurality of sintering films; jetting sintering paste onto the release film to form the plurality of sintering films; or applying sintering paste across the release film and forming the plurality of sintering films using an inverted mold.

Applying pressure between the plurality of sintering film frames and the release film further may include heating the plurality of sintering film frames.

Implementations of a method of using a sintering film may include unloading a plurality of sintering film frames from a frame transport container, each of the plurality of sintering film frames including a sintering film supported by a release film in an opening of each sintering film frame; automatically identifying each of the plurality of sintering film frames using a frame identifier on a side of each sintering film frames; and automatically loading each of the plurality of sintering film frames onto a sintering tray station.

Implementations of a method of using a sintering film may include one, all, or any of the following:

Unloading the plurality of sintering film frames from the frame transport container may occur automatically.

Automatically loading each of the plurality of sintering film frames further may include sliding each sintering film frame onto the sintering tray station.

Automatically loading each of the plurality of sintering film frames further may include picking and placing each sintering film frame onto the sintering tray station.

The plurality of sintering films may include one of silver, copper, silver alloys, copper alloys, or any combination thereof.

The method may include laminating and transferring a portion of the sintering film to a die.

The method may include bonding the die to a substrate at the portion of the sintering film.

The method may include pressure sintering the die to the substrate using the portion of the sintering film.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
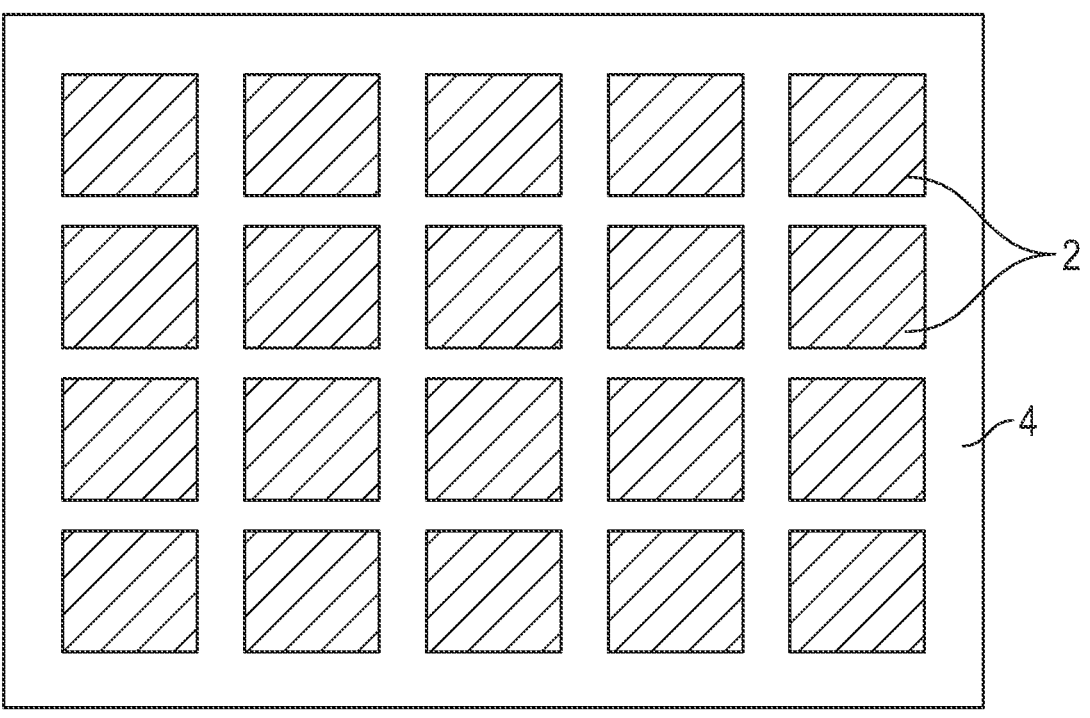
FIG. 1 is a top view of an implementation of a release film to which a plurality of sintering films have been applied in a spaced apart relationship.

This disclosure, its aspects and implementations, are not limited to the specific components, assembly procedures or method elements disclosed herein. Many additional components, assembly procedures and/or method elements known in the art consistent with the intended sintering film frames and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such sintering film frames, and implementing components and methods, consistent with the intended operation and methods.

Sintering film implementations like those disclosed herein can be used in pressure sintering operations where a semiconductor die is bonded to a substrate or other package under the influence of pressure and elevated temperature. The material of the sintering film becomes at least a portion of what forms the mechanical connection between the semiconductor die and the substrate/package. Particular implementations of sintering film implementations disclosed herein may be used with silicon carbide semiconductor die. However, the sintering film implementations may be used with any other semiconductor die substrate type or device type where sintering can be utilize. The thickness of sintering films is typically thin (100 microns or less) and so its mechanical strength is low enough to allow it to be torn when touched by hand or when blown on by air. Thus, manual handling of sintering films can result in a significant amount of scrap/damage to the sintering films at each stage of the sintering process. The various sintering film implementations disclosed herein may be composed of, by non-limiting example, silver, copper, silver alloys, copper alloys, any combination thereof, or any other material capable of forming a mechanical/electrical bond through a sintering process.

The process of applying the sintering film to a semiconductor die first involves the formation of the sintering film and preparation of the sintering film for transport. Implementations of a method of preparing sintering film for use in a sintering film die bonding process include forming a master sintering film. In various method implementations, this is accomplishing via casting where a metal like silver or copper is being used. In other implementations, however, particularly where multi-layer sintering films are employed, part or all of the sintering film may be, by non-limiting example, electroplated, electroless plated, rolled, deposited, sputtered, chemically vapor deposited, or any other method of forming a uniform layer of a material suitable for sintering. In the various method implementations disclosed herein, the size and shape of the master sintering film may take various desired shapes, including, by non-limiting example, rectangular, square, elliptical, circular, or any other closed shape.

Following formation of the mastering sintering film, the master sintering film is cut into a plurality of sintering films. In various method implementations like those illustrated herein, each sintering film of the plurality of sintering films may be cut to the same dimensions or substantially the same dimensions, but in other implementations one or more of the plurality of sintering films can have different dimensions from the others. Because of the effect of the sintering film frame implementations disclosed herein, the shape of each of the plurality of sintering films can take on a wide variety of shapes, including, by non-limiting example, elliptical, circular, a rounded rectangle, a rounded square, rectangular, square, a quadrilateral, triangular, polygonal, or any other closed shape. The cutting process of the master film may take place using any singulation process capable of removing material through the entire thickness of the sintering film, including, by non-limiting example, lasering, sawing, etching, scribing and breaking, any combination thereof, or any other method of separating the sintering films from the material of master sintering film.

In various method implementations, during or after the cutting process, each of the sintering films is collected for application to a release film. In some method implementations, the sintering films may be manually collected and manually applied to the release film; in other method implementations, the sintering films may be automatically collected and automatically applied to the release film. In yet other method implementations, the sintering films may be manually collected and automatically applied to the release film and in yet other implementations, the sintering films may be automatically collected and manually applied to the release films. The ability, however, to automatically collect and automatically apply the sintering films to the release film may reduce the potential for damage to the sintering films and thus reduce losses and costs associated with scrap which can be considerable depending on the cost of the material used for the sintering film.

In other method implementations, however, a master film may not be cast and cut at all, but the plurality of sintering films formed in place on the release film in the desired spaced apart relationship. In a first implementation, screen printing using a sintering paste and a screen template is used to lay down sintering paste in the desired sintering film shape using the spacing of the screen to establish the desired spacing between the sintering films. In various method implementations a printing scraper or squeegee may be used to distribute the sintering pasted in the screen and ensure the desired level of uniformity of the sintering paste prior to removal of the screen. An additional curing/drying/heating process may be carried out in various method implementations to harden/stiffen the sintering films prior to additional processing. In a second implementation, a nozzle may be used to jet sintering paste onto the release film to form spaced apart sintering films of a desired shape and in a desired spacing relationship. In this implementation, an additional curing/drying/heating process may be used to level/make the surface of the jetted sintering films as uniform and hard/stiff as desired prior to additional processing. In a third implementation, sintering paste may be spread across a majority of the transfer film and an inverted mold pressed down over the sintering paste and used to mold the sintering films into the desired shape and thickness and with the desired spacing. In this method, the desired spacing is set by the projections of the inverted mold that directly contact the transfer film during the molding process and serve to displace the sintering paste into the areas where the sintering films are being formed. In various implementations, the invert mold may fully contact the material of the sintering paste when fully contacting the transfer film to achieve the desired shape and thickness for each sintering film; in others the invert mold may not fully contact all of the material that forms each sintering film. Following the molding process, an additional curing/drying/heating process may be employed to level/make the surface of the sintering films as uniform and hard/stiff as desired prior to further processing in various method implementations. In the molding method implementation, a release film or coating may be included on the invert mold to help ensure that mold cleanly releases from the sintering paste after molding and does not cause undesired non-uniformity on the sintering film surfaces.

As illustrated in FIG. 1, the plurality of sintering films 2 are applied to/formed on the release film 4 in a spaced apart relationship. In the release film implementation illustrated in FIG. 1, the spaced apart relationship is that of equally spaced rows and columns to form a grid separated by release film material. In other implementations, however, the spaced apart relationship may be just rows, just columns, or an alternating arrangement where alignment of the sintering films is on diagonals where, by non-limiting example, circular or triangularly shaped sintering films are applied in an alternating pattern to maximize use of the release film while still allowing for spacing between each sintering film. In yet other implementations the spaced apart relationship may take the form of a rhythm or repetition of two or more sintering films interchangeably such as, by non-limiting example, an alternating rhythm, a random rhythm, a regular rhythm, or any other rhythm type.

Figure 2:
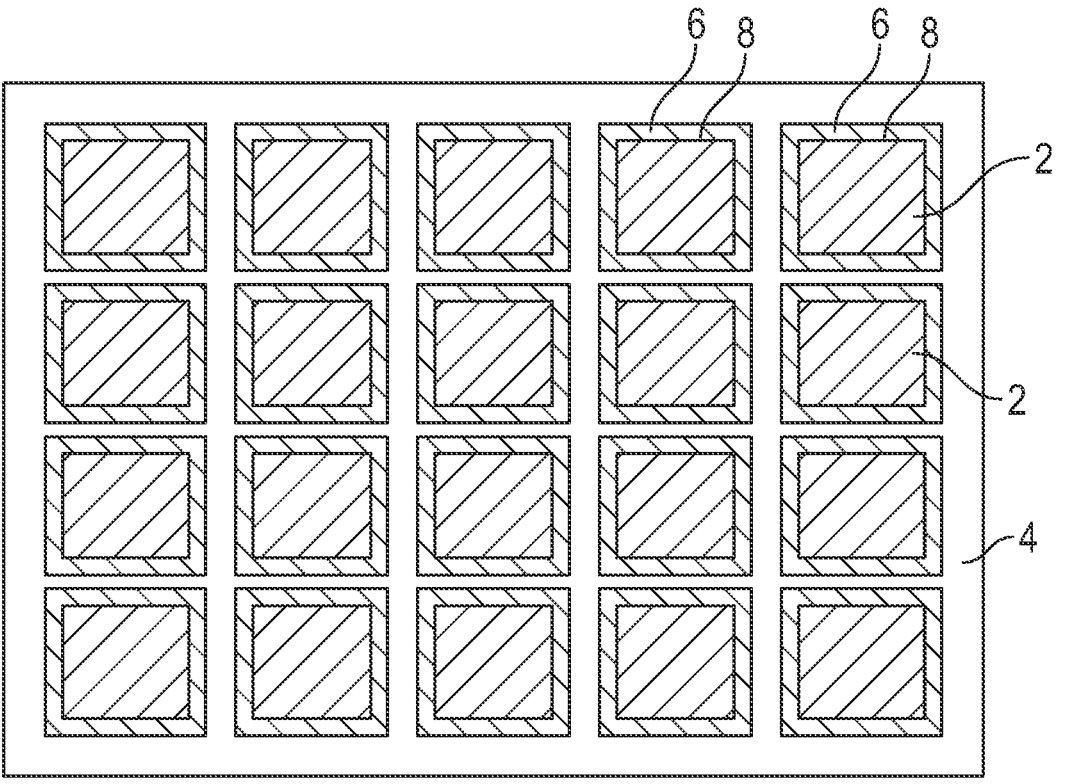
FIG. 2 is a top view of the implementation of the release film of FIG. 1 with a plurality of sintering film frames coupled thereto around the plurality of sintering films.

Referring to FIG. 2, the plurality of sintering films 2 are illustrated after a plurality of sintering film frames 6 have been coupled to the release film 4. In various method implementations, the sintering film frames 6 are coupled to the same side of the release film 4 to which the plurality of sintering films 2 have been coupled. As illustrated, each of the sintering film frames 6 has an opening therethrough that accommodates the size of each of the sintering films 2. Since the plurality of sintering films 2 illustrated in FIG. 2 is rectangular, the plurality of sintering film frames 6 each includes a corresponding rectangular opening 8 therethrough. However, the opening of one, some, or all of the sintering film frames may not be rectangular but may take any shape previously disclosed for the sintering films themselves. While the shape of the opening in the sintering film frames 6 is illustrated to correspond with the shape of the sintering films 2, in some method implementations, the openings 8 may not be the same shape as the sintering films 2 but may be larger enough to allow the shape/size of the sintering films to fit inside the opening. In this way a set of sintering film frames can be used with multiple sizes/shapes of sintering films.

Figure 3:
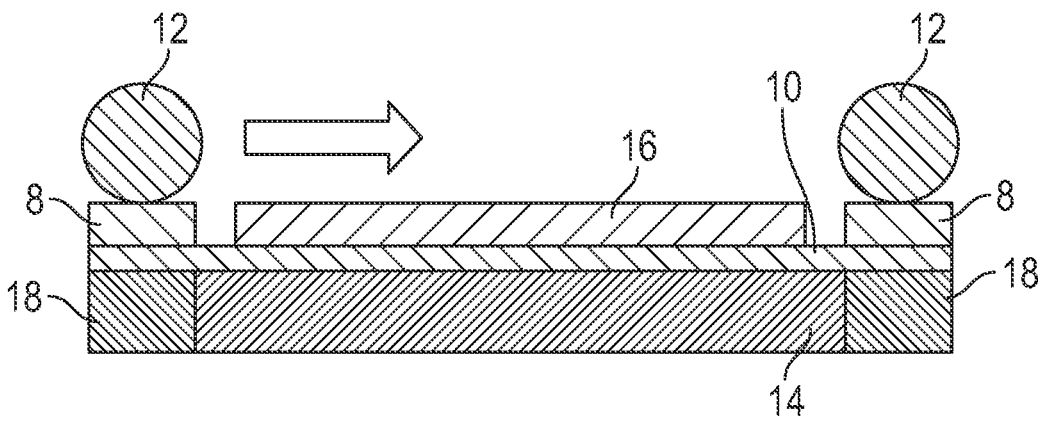
FIG. 3 is a side view of an implementation of a sintering film frame being coupled with a release film.

Referring to FIG. 3, a side view of a sintering film frame 8 is illustrated during application to the release film 10 using rollers 12 and chuck table 14. As illustrated, the rollers 12 may be used to pass over the sintering film frame 8 and the sintering film 16 already attached to the release film 10 to apply pressure to the sintering film frame 8 against the release film 10 as it is supported by the chuck table 14. In particular implementations, a heating frame 18 may be included as part of or coupled to the chuck table 14 that heats the portion of the release film 10 adjacent to the sintering film frame 8 to help with the coupling process. In various implementations, the heating frame 18 may have the same dimensions or similar dimensions to the sintering film frame 8. In others, however, the heating frame may cover only a portion of the dimensions of the sintering film frame 8. In some implementations, the entire chuck table 14 may be heated and no separate heating frame employed. In yet other implementations, just a portion of the chuck table 14 may be heated and no physically separate film frame employed.

Figure 4:
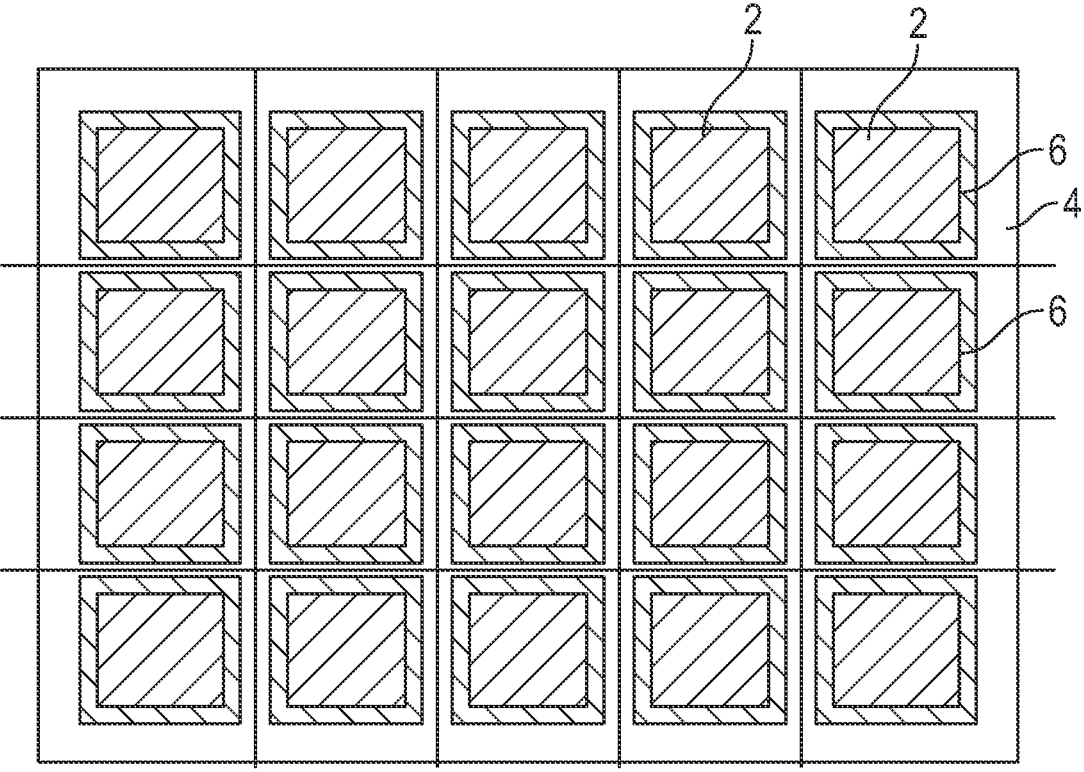
FIG. 4 is a top view of the implementation of the release film of FIG. 2 following singulation around the plurality of sintering film frames.

Referring to FIG. 4, with the plurality of sintering film frames 6 coupled to the release film 4, the release film 4 is then singulated to separate the plurality of sintering film frames from each other. In this process, each sintering film 2 is now supported only by the corresponding sintering film frame 6 using the remaining release film 4 coupled to the frame. As part of this process, the now separated plurality of film frames 6 can be manually or automatically collected/transported for further processing operations as described herein.

Figure 5:
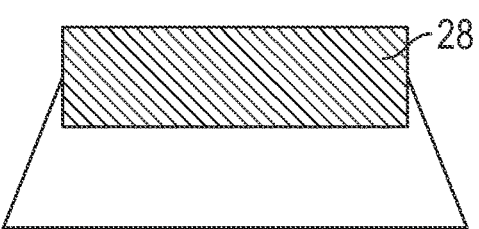
FIG. 5 is a side view of an implementation of a sintering film frame during inspection.
Figure 5:
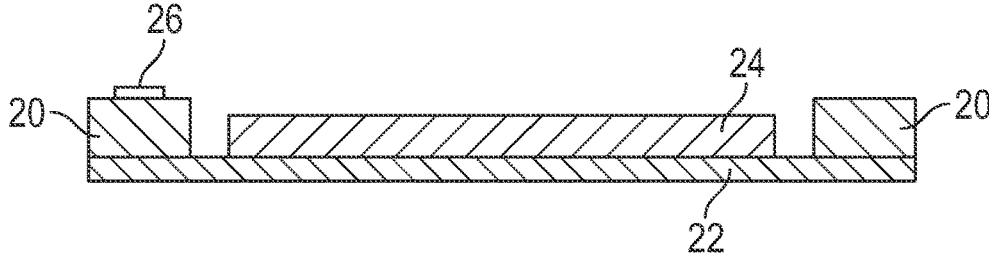

Referring to FIG. 5, a side view of a singulated sintering film frame 20 with release film 22 holding sintering film 24 thereon is illustrated. As illustrated, this sintering film frame 20 also includes a frame identifier 26 on a side of the frame 20. While the frame identifier 26 is illustrated as extending above the surface of the frame 20, in other implementations the frame identifier 26 may be flush with the surface of the frame 20. Above the sintering film frame 20 is a visual inspection system 28 which may, in various method implementations, take the form of a visual (1×) or scope (5× or other magnification) that is used to inspect the sintering film 24 for defects or other issues. In various method implementations, the visual inspection system 28 includes a component for reading the frame identifier 26 to record an order of arrival of the sintering film frame 20, an identity of the sintering film frame 20, or both the order of arrival and identity of the sintering film frame 20. The visual inspection system 28 may then store this information in a database or other computing system for later use in the various method implementations disclosed herein. In this way, the method implementation enables identification of specific sintering films and tracking of the sintering films through rest of the sintering process.

Figure 6:
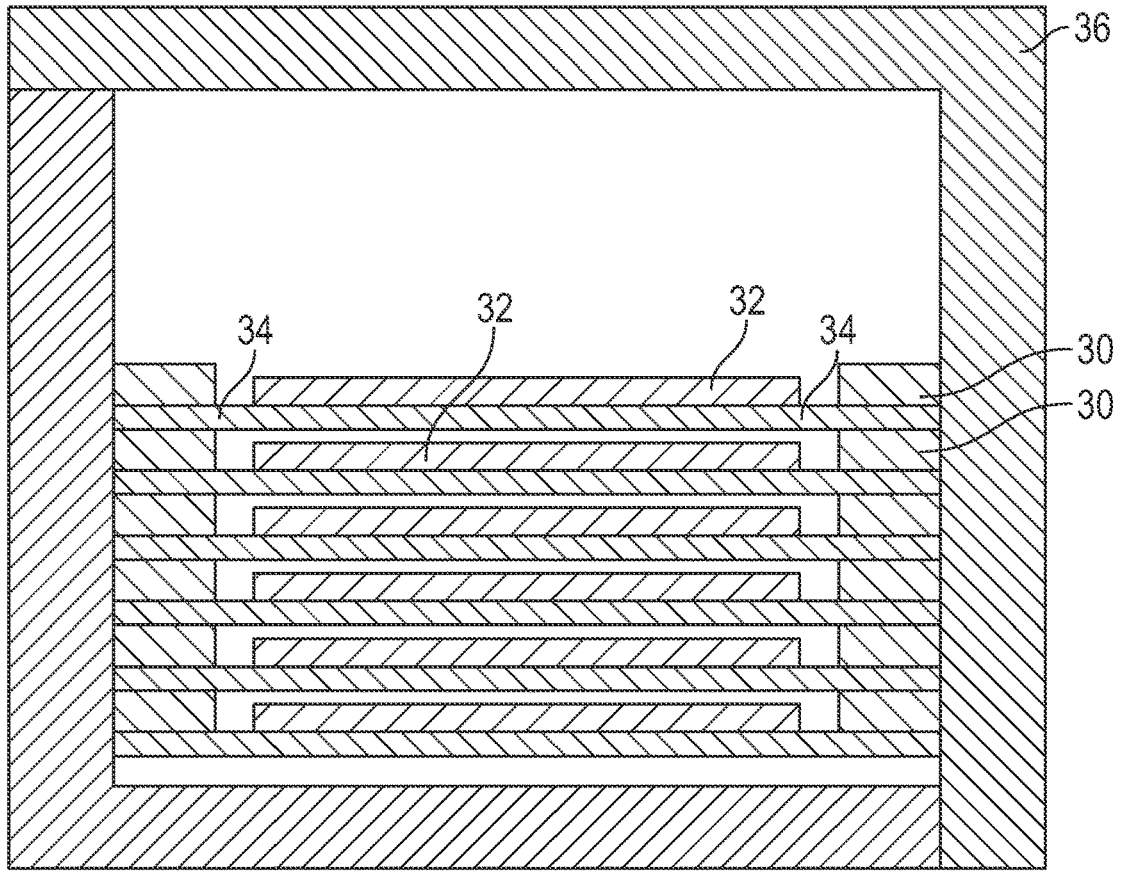
FIG. 6 is a side view of a plurality of sintering film frames loaded into an implementation of a frame transport container.

Whether the sintering film frames are manually or automatically collected after singulation, various method implementations include packing the sintering film frames into a frame transport container 36 like that illustrated in FIG. 6. FIG. 6 shows six stacked sintering film frames 30 which are all shown resting frame on frame. Because the thickness of the frame is thicker than the thickness of the sintering films 32 coupled to the release films 34 of each sintering film frame, the thickness of each frame serves to protect the sintering films 32 from damage during the packing and transport process. In various implementations, the information regarding the identity of and/or order of loading of each sintering film frame 30 into the transport container 36 may be stored in/with the transport container 36 or may be electronically communicated to the person/entity that will receive the transport container 36 for later processing. In various method implementations, the packing process takes place automatically. In other implementations, the packing process may take place manually. In various implementations, the sintering film frames may not be stacked frame on frame but may be slid into slots formed in the interior sides of the frame transport container 36. Because the sintering films 32 are now being transported attached to release films 34 and supported by a sintering film frames 30, no manual handling of the actual sintering films 32 needs to be carried out in the packing or unpacking process even if a manual packing process is used to pack the sintering film frames. This handling of the sintering film frames rather than the sintering films themselves can reduce the amount of potential damage that can occur during the packing process.

Figure 7:
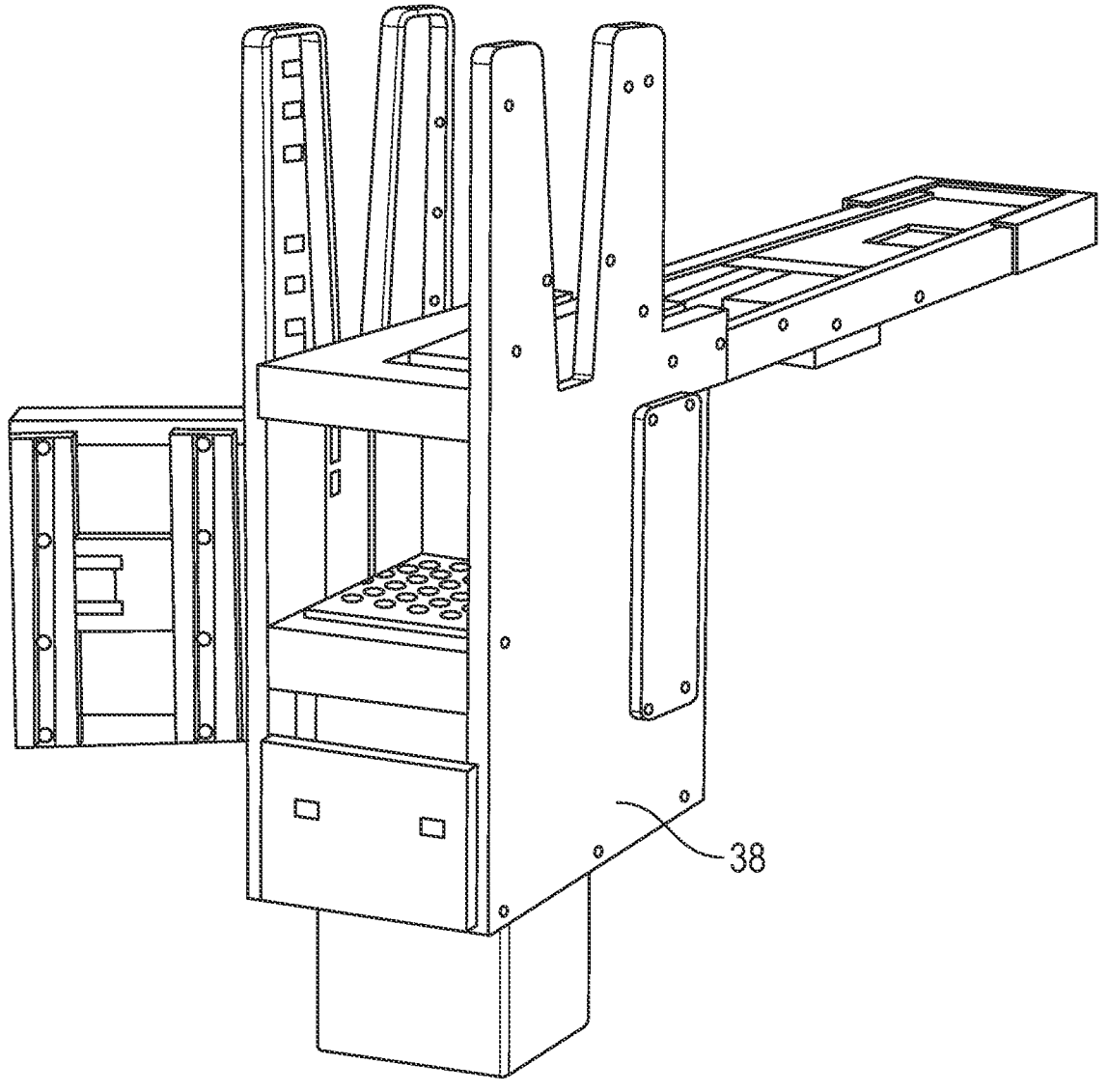
FIG. 7 is a perspective view of an implementation of a frame-to-frame stack loader.

Following loading of the sintering film frames into the frame transport container 36, the frame transport container 36 is then be shipped/transported to a location where the sintering films can be used in package assembly. Implementations of a method of using a sintering film in a sintering process like those disclosed herein include unloading the sintering film frames stored in the frame transport container. Referring to FIG. 7, this may take place using a frame-to-frame stack loader 38 implementation like that illustrated into which the frame transport container 36 has been placed. This frame-to-frame stack loader 38 may unload each sintering film frame onto a conveyor belt or line that then transports the sintering film frame to a sintering tray station (not illustrated in FIG. 7). In other implementations, the frame transport container can be manually unloaded onto a conveyor belt or line which then transports the sintering film frame to the sintering tray station. In yet other method implementations, the frame-to-frame stack loader 38 can be used to unload the sintering film frame to a location where the sintering film frame is then picked and placed onto the sintering tray station.

The use of automatic unloading may further assist with prevention of damage to the sintering films supported by the plurality of sintering film frames in the frame transport container. In various method implementations, the method includes automatically identifying each of the sintering film frames with the frame-to-frame stack loader 38 (or a barcode or other reading instrument and the frame identifier) as each exits the frame transport container or as each passes along the conveyor belt or line. In this way, each sintering film's progress to the sintering tray station from the frame transport container (and into the frame transport container) can be documented and associated with the particular semiconductor die to be processed in various method implementations.

Figure 8:
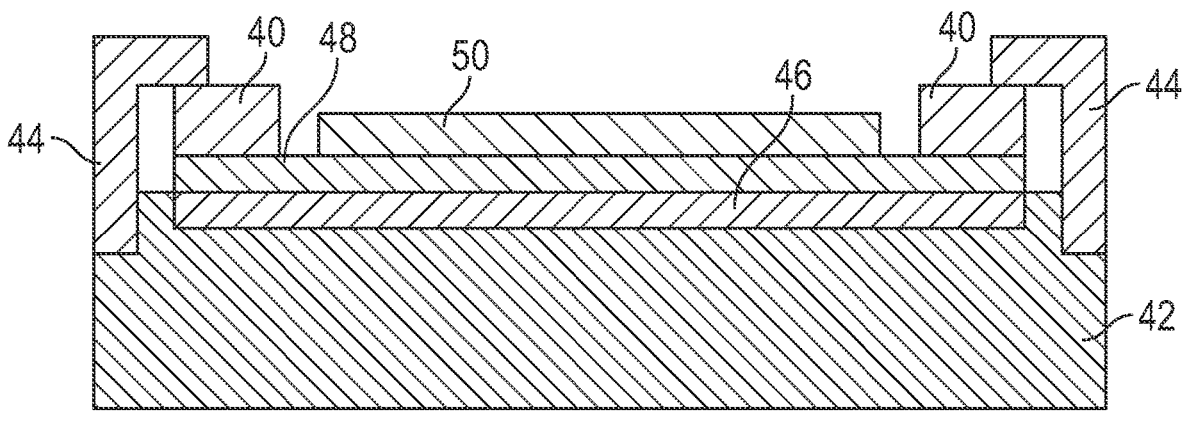
FIG. 8 is a side view of an implementation of a sintering film frame coupled onto a sintering tray station.

Referring to FIG. 8, an implementation of a sintering film frame 40 is illustrated that has been coupled to a sintering tray station 42 using clamps 44. The sintering tray station 42 includes a rubber sheet 46 that contacts the release film 48 that is supporting the sintering film 50. In various method implementations, the movement of the sintering film frame 40 to the sintering tray station 42 occurs automatically. In some implementations, the automatic loading takes place by sliding the sintering film frame 40 over/onto the sintering tray station 42. In other implementations, the automatic loading takes place by picking and placing the sintering film frame 40 over/onto the sintering tray station 42. Once loaded onto the sintering tray station 42, the sintering film 50 is now ready for further processing to enable sintering of semiconductor die.

Figure 12:
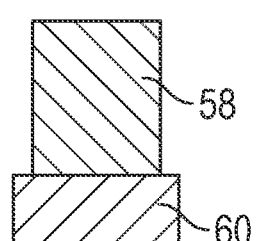
FIG. 12 is a side view of an implementation of wafer with a semiconductor die being picked therefrom.
Figure 12:
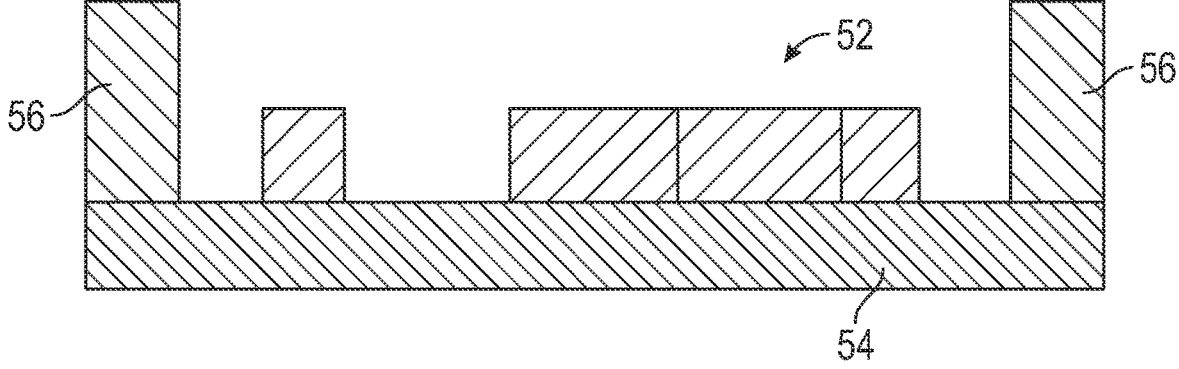

Referring to FIG. 12, an implementation of a singulated semiconductor wafer 52 coupled to a picking tape 54 supported by a frame 56 is illustrated with die picking head

58 holding a die 60 that has been picked from the tape 54. In various method implementations, the picked die 60 may be loaded into a pocket of a tape and reel that is rolled up and brought to the tool that includes the sintering tray station. In other implementations, the picked die may be directly processed at the sintering tray station right after picking from the picking tape. The semiconductor die may be any disclosed in this document.

Figure 13:
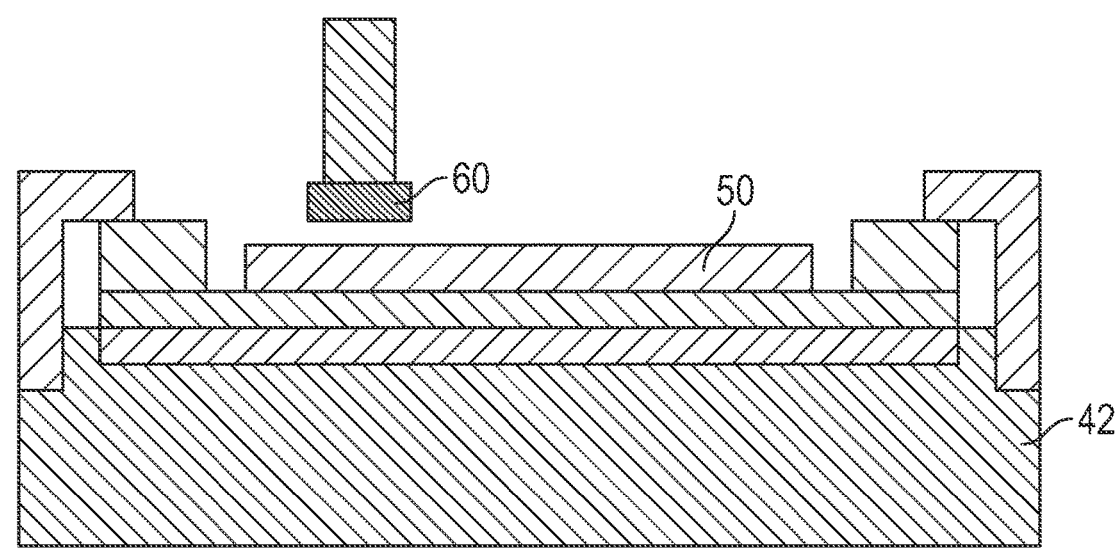
FIG. 13 is a side view of a sintering tray station implementation during lamination of a portion of sintering film to a semiconductor die.
Figure 14:
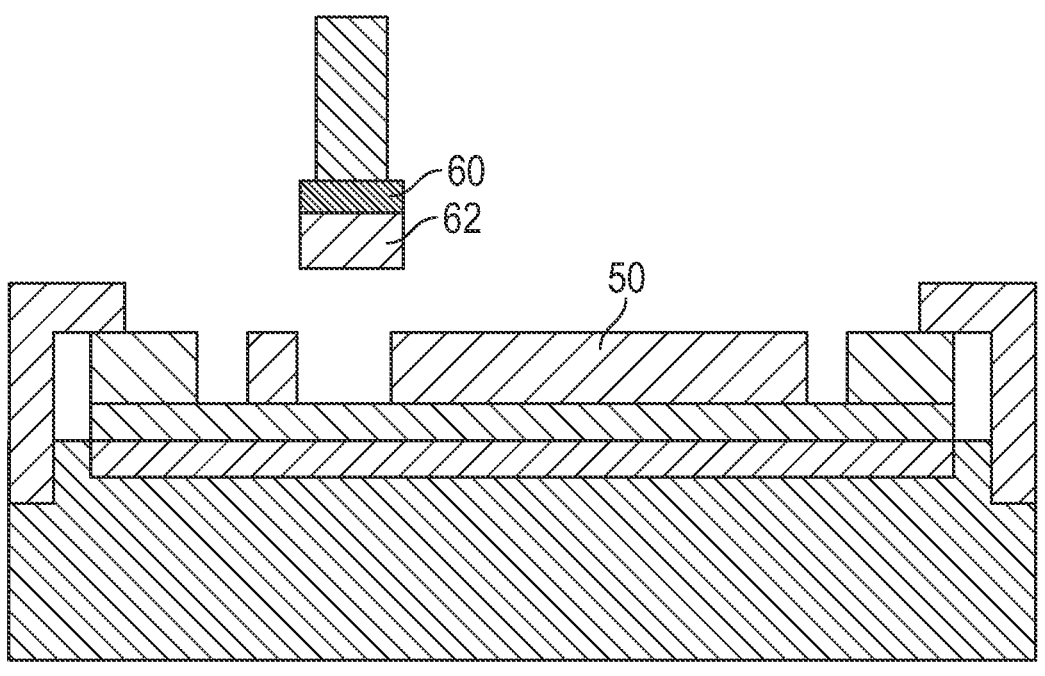
FIG. 14 is a side view of the semiconductor die of FIG. 13 following film transfer of the portion of the sintering film.

Referring to FIG. 13, the picked die 60 (whether taken from tape and reel or directly from the picking tape), is illustrated while contacting the sintering film 50 during a lamination process which forms an initial bond of a portion of the sintering film 50 to the side of the picked die 60 that is in contact with the film. Heat may be applied in various method implementations via the sintering tray station 42 to aid in the lamination process. FIG. 14 illustrates the die 60 following transfer or the portion 62 of the sintering film 50 to the die 60. Because the portion 62 has been laminated to the picked die 60, the bond between the die 60 and the portion 62 is stronger than the bond between the release film and the portion and the bond between the portion 62 and the remainder of the sintering film 50 itself. In this way, the portion 62 can be removed without having to pre-cut/singulate the sintering film 50.

Figure 15:
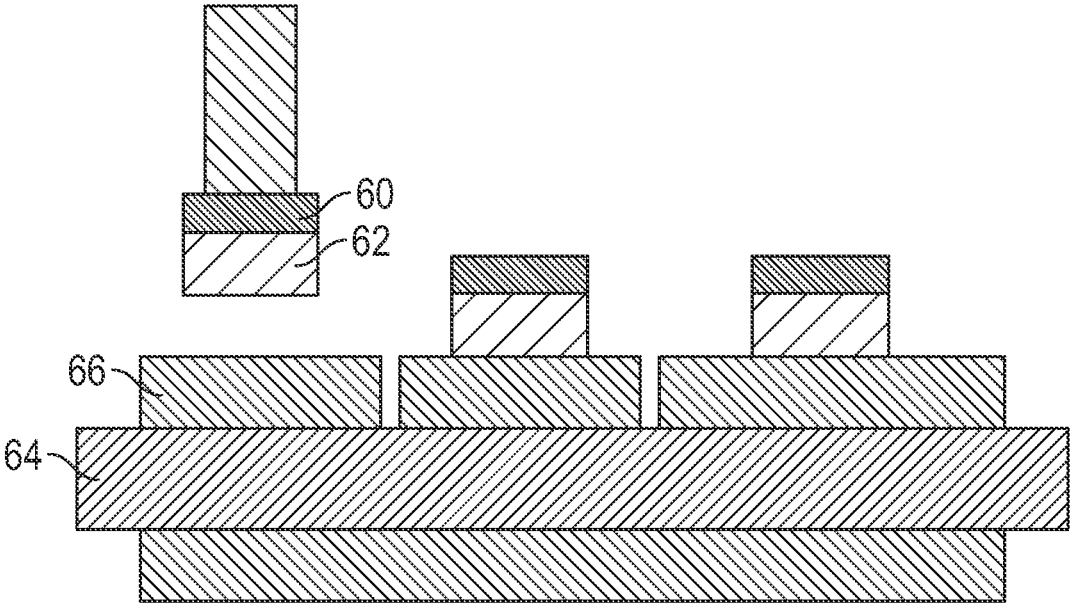
FIG. 15 is a side view of the semiconductor die of FIG. 14 just prior to die bonding at the portion of the sintering film.
Figure 16:
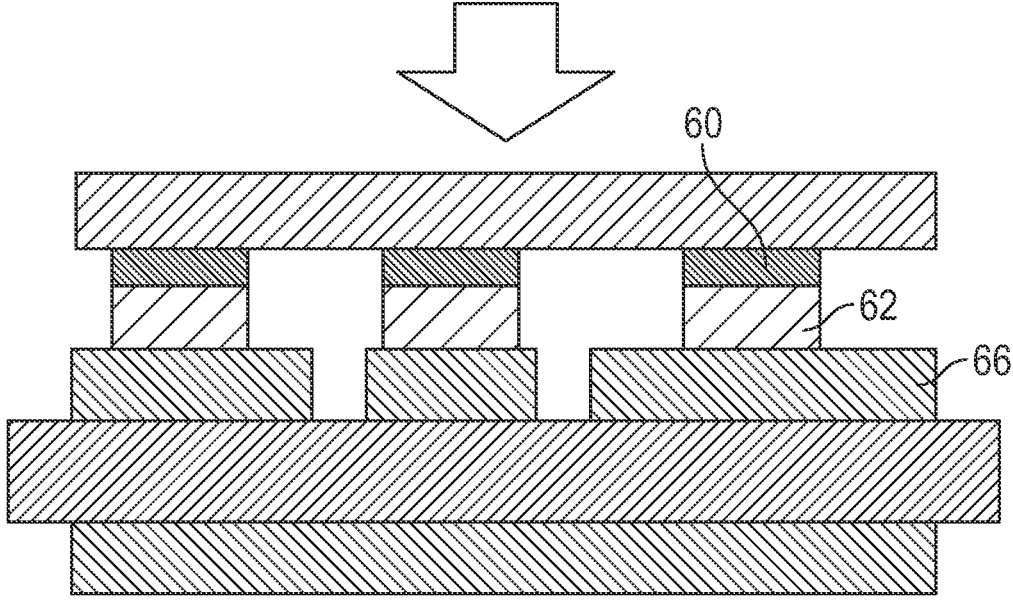
FIG. 16 is a side view of the semiconductor die of FIG. 15 during pressure sintering.

Now that the portion 62 is transferred to the die 60, the die 60 is ready for further bonding and sintering processes with a substrate/package. FIG. 15 illustrates the die 60 as it is being prepared to be bonded to a corresponding portion/pad 66 of substrate 64 using the portion 62 of the sintering film. Once bonded to the substrate 64, the die 60 and the portion 62 of the sintering film are now ready to undergo a pressure sintering process like that illustrated in FIG. 16 where pressure and heat are applied to the die 60 against the pad/portion 66 of the substrate 64 and the portion 62 is used to form a sintered bond with the pad/portion 66. At this point the die 60 and substrate 64 are ready for additional final packaging steps, such as, by non-limiting example, encapsulation, molding, wire bonding, or any other packing process needed to finish establishing mechanical and/or electrical connections to the die.

Figure 9:
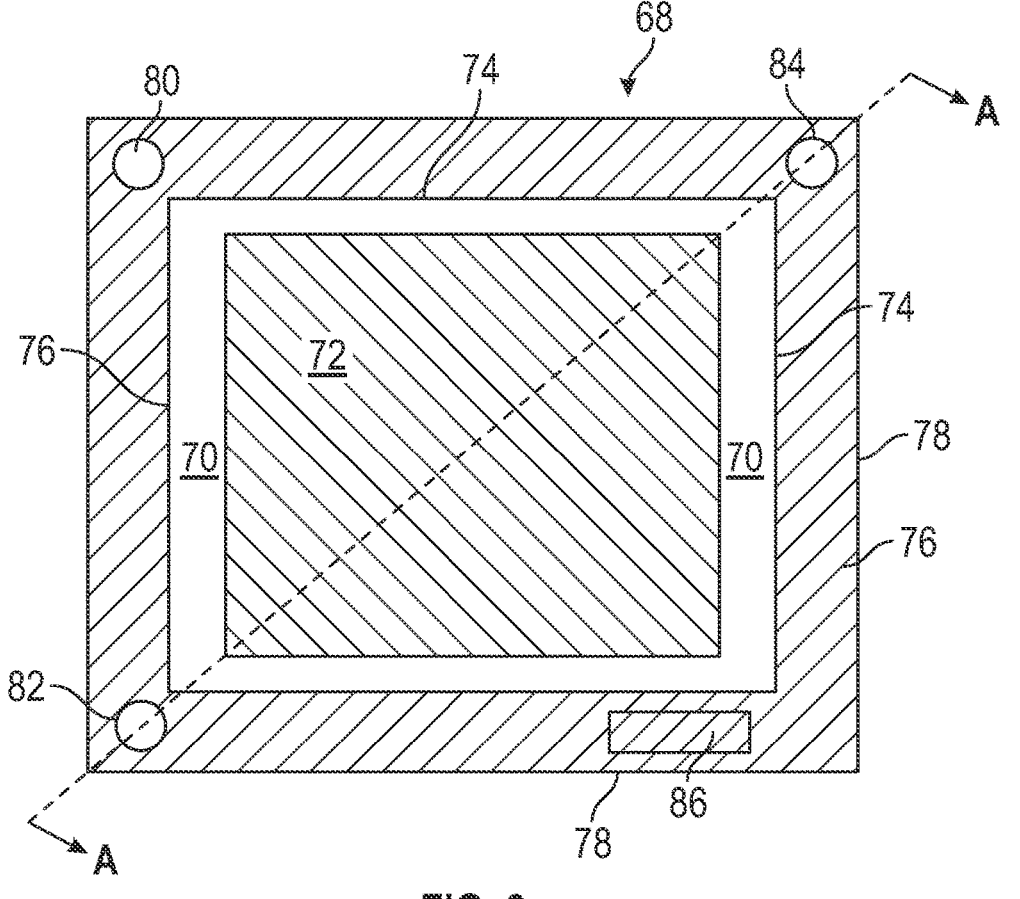
FIG. 9 is a top view of an implementation of a sintering film frame coupled around a sintering film with a release film.

The various method implementations disclosed in this document can employ any of a wide variety of various sintering film frame implementations disclosed in this document. Referring to FIG. 9, a top view of an implementation of a sintering film frame 68 is illustrated. In this implementation, a release film 70 and sintering film 72 are currently coupled to the sintering film frame 68. As illustrated, the sintering film frame 68 includes an opening/sintering film opening 74 through the thickness (Width D) of the material of the frame 68 which can be seen in the cross sectional view along sectional line A-A of FIG. 9 to have width B. Width B is larger than Width A of the sintering film 72 to provide some spacing between the material of the sintering film frame 68 for the release film 70 to support the sintering film 72. The perimeter 76 of the opening 74 forms an inner perimeter of the sintering film frame 68 and the perimeter 78 of the outside edge/surface of the sintering film frame 68 forms an outer perimeter of the sintering film frame 68 (a width of this outer perimeter is illustrated as Width C in FIG. 10).

Figure 10:
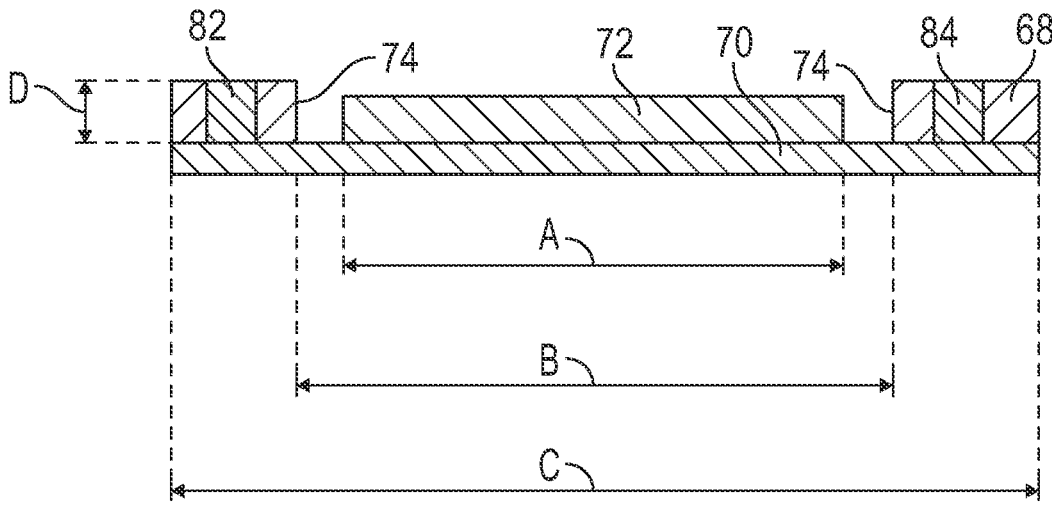
FIG. 10 is a cross sectional view along sectional line A-A of FIG. 9 of an implementation of a sintering film frame coupled around a sintering film with a release film.
Figure 11:
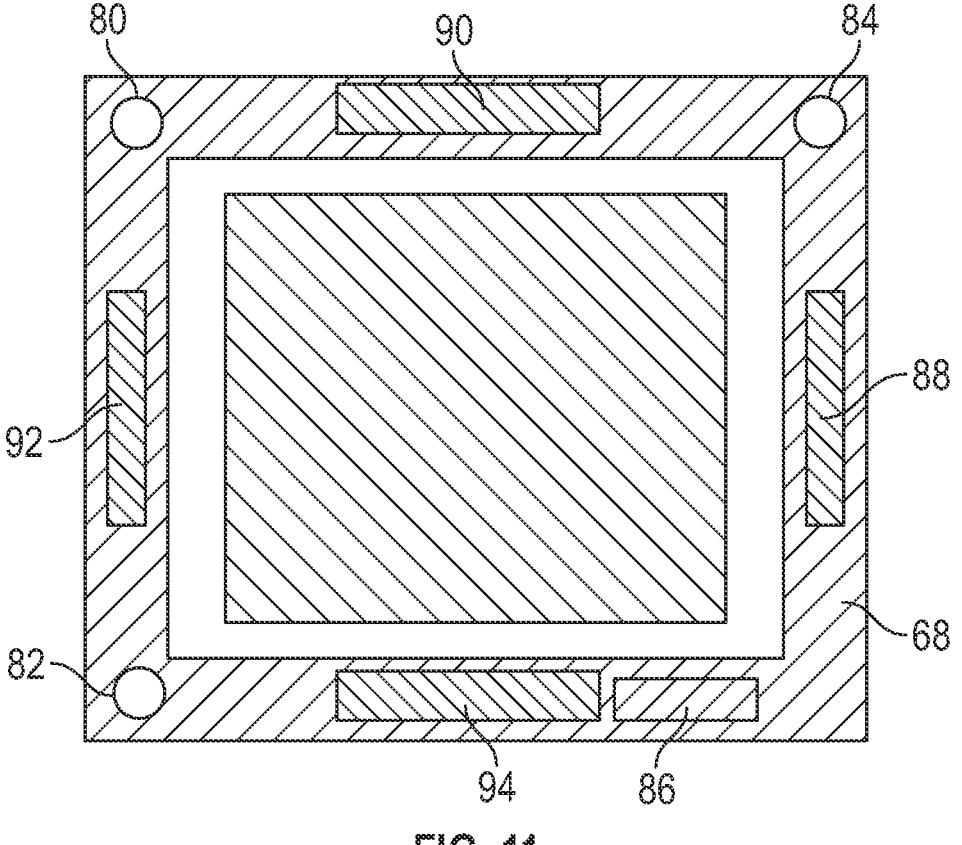
FIG. 11 is a top view of an implementation of a sintering film frame showing pick and place locations along the frame.

Various openings can be included in various sintering film frame implementations to assist in the processing operations. The implementation of FIG. 9 includes a position detection opening 80 at one corner/position of the sintering film frame 68 which can work in combination with a position sensor in the sintering tray station to detect whether the sintering film frame 68 has been properly placed onto a sintering tray station. The implementation of FIG. 9 also includes two alignment holes 82, 84 which pass through the material of the frame and are illustrated in cross section in FIG. 10. These alignment holes 82, 84 can work with a corresponding two or more positioning pins in the sintering tray station to allow for accurate alignment of the sintering film frame over the sintering tray as detected by the position sensor using the position detection opening 80. While the use of a position detection opening 80 in combination with alignment holes 82, 84 is illustrated in FIGS. 9-11, the other implementations, only a position detection opening 80 may be used, or only alignment holes 82, 84 may be utilized. More than two alignment holes may also be included in various implementations of sintering film frames as well.

FIG. 9 also illustrates a frame identifier 86 included on a side of the sintering film frame 68 which is located on a surface of the frame between the inner and outer perimeters. A wide variety of frame identifier types may be employed in various frame implementations, including, by non-limiting example, a barcode, a two dimensional barcode, a set of characters, any combination thereof, or any other visually or light detectable features that can be used to identify the sintering film frame. While one frame identifier 86 is illustrated in FIGS. 9 and 11, more than one frame identifier could be used in various sintering film frame implementations.

Referring to FIG. 11, four pick and place locations 88, 90, 92, 94 are illustrated that may be utilized when the sintering film frame 68 is being transported using a pick and place method. In various method implementations, one, all, or any combination of the pick and place locations 88, 90, 92, 94 may be used during picking and placing of the sintering film frame. In various sintering film frame implementations, the pick and place locations may be indicated on the surface of the frame using, by non-limiting example, a painted indicator, a laser marked indicator, a depression, a raised area, or any other visually perceptible shape/structure.

In places where the description above refers to particular implementations of sintering film frames and related methods and implementing components, sub-components, methods and sub-methods, it should be readily apparent that a number of modifications may be made without departing from the spirit thereof and that these implementations, implementing components, sub-components, methods and sub-methods may be applied to other sintering film frames and related methods.

What is claimed is:

1. A sintering film frame comprising:
a frame comprising an outer perimeter and an inner perimeter, the inner perimeter defining an opening through the frame;
a position detection opening through the frame;
at least two alignment holes through the frame; and
a frame identifier on a side of the frame.

2. The frame of claim 1, wherein a shape of the outer perimeter is one of elliptical, circular, a rounded rectangle, or a rounded square.

3. The frame of claim 1, wherein a shape of the outer perimeter is one of rectangular, square, or a quadrilateral.

4. The frame of claim 1, wherein a shape of the inner perimeter is one of elliptical, circular, a rounded rectangle, or a rounded square.

5. The frame of claim 1, wherein a shape of the inner perimeter is one of rectangular, square, or a quadrilateral.

6. The frame of claim 1, wherein the frame identifier is one of a barcode, a two dimensional barcode, or a set of characters.

7. The frame of claim 1, wherein the sintering film frame includes only two alignment holes in opposing corners of the sintering film frame.

8. A method of preparing sintering film, the method comprising:
coupling a release film to a plurality of sintering films so each of the plurality of sintering films is arranged in a spaced apart relationship from each other sintering film of the plurality of sintering films on the release film;
coupling a plurality of sintering film frames to the release film, each of the plurality of sintering film frames coupled around each of the plurality of sintering films;
applying pressure between the plurality of the sintering film frames and the release film;
cutting the release film around each of the plurality of sintering film frames to singulate the plurality of sintering film frames; and
packing the plurality of sintering film frames into a frame transport container.

9. The method of claim 8, further comprising:
casting a master sintering film; and
cutting the master sintering film into the plurality of sintering films.

10. The method of claim 8, further comprising:
visually inspecting the plurality of sintering films after cutting the release film prior to packing the plurality of sintering film frames; and
recording one of an order, an identity, or both an order and an identity of each of the sintering film frames using a frame identifier of each of the sintering film frames while packing the plurality of sintering film frames into the frame transport container.

11. The method of claim 8, wherein coupling the release film to the plurality of sintering films further comprises one of:
screen printing sintering paste onto the release film to form the plurality of sintering films;
jetting sintering paste onto the release film to form the plurality of sintering films; or
applying sintering paste across the release film and forming the plurality of sintering films using an inverted mold.

12. The method of claim 8 wherein applying pressure between the plurality of sintering film frames and the release film further comprises heating the plurality of sintering film frames.

13. A method of using a sintering film, the method comprising:
unloading a plurality of sintering film frames from a frame transport container, each of the plurality of sintering film frames comprising a sintering film supported by a release film in an opening of each sintering film frame;
automatically identifying each of the plurality of sintering film frames using a frame identifier on a side of each sintering film frames; and
automatically loading each of the plurality of sintering film frames onto a sintering tray station.

14. The method of claim 13, wherein unloading the plurality of sintering film frames from the frame transport container occurs automatically.

15. The method of claim 13, wherein automatically loading each of the plurality of sintering film frames further comprises sliding each sintering film frame onto the sintering tray station.

16. The method of claim 13, wherein automatically loading each of the plurality of sintering film frames further comprises picking and placing each sintering film frame onto the sintering tray station.

17. The method of claim 13, wherein the plurality of sintering film frames comprise one of silver, copper, silver alloys, copper alloys, or any combination thereof.

18. The method of claim 13, further comprising laminating and transferring a portion of the sintering film to a die.

19. The method of claim 18, further comprising bonding the die to a substrate at the portion of the sintering film.

20. The method of claim 19, further comprising pressure sintering the die to the substrate using the portion of the sintering film.

\* \* \* \* \*